United States Patent [19]

Yamamoto et al.

[11] Patent Number: 4,774,165

[45] Date of Patent: Sep. 27, 1988

[54] METHOD FOR DIRECT MAKING OF LITHOGRAPHIC PRINTING PLATES

[75] Inventors: Kyonosuke Yamamoto; Kazuhito Hasegawa; Masaharu Tatikawa; Kazuyuki Ebara; Isamu Maruyama, all of Nagaokakyo, Japan

[73] Assignee: Mitsubishi Paper Mills, Ltd., Tokyo, Japan

[21] Appl. No.: 109,309

[22] Filed: Oct. 19, 1987

Related U.S. Application Data

[63] Continuation of Ser. No. 832,772, Feb. 25, 1986, abandoned.

[30] Foreign Application Priority Data

Feb. 26, 1985 [JP] Japan .................. 60-38082
Feb. 26, 1985 [JP] Japan .................. 60-38083

[51] Int. Cl.$^4$ ................................ G03C 7/00
[52] U.S. Cl. ........................ 430/301; 430/22; 430/302; 430/394; 430/494
[58] Field of Search ............... 430/22, 301, 302, 394, 430/494, 307

[56] References Cited

U.S. PATENT DOCUMENTS

| | | |
|---|---|---|
| 3,776,733 | 12/1973 | Lohmer et al. .................. 430/494 |
| 4,187,107 | 2/1980 | Homma et al. .................. 430/307 |
| 4,262,070 | 4/1981 | Liu .................................. 430/394 |
| 4,565,771 | 1/1986 | Lynch et al. ..................... 430/307 |
| 4,610,949 | 9/1986 | Kanada et al. ................... 430/394 |

*Primary Examiner*—Jack P. Brammer
*Attorney, Agent, or Firm*—Cushman, Darby & Cushman

[57] ABSTRACT

Disclosed is a direct making of multicolor printing plates by the procedure of exposing a photosensitive material (P) of the lithographic type for making a black plate to an original bearing both the continuous tone image and the line images. The said procedure comprises (1) exposure to the continuous tone image which is performed by exposing the sensitive material (P) through a contact screen to the original in which the line images are covered with a mask (M-1) having an optical reflectance of 2% or less and the continuous tone image is covered with a mask (M-2) having a large optical reflectance, then again exposing, in the absence of contact screen, the sensitive material (P) to the original in which the line images are covered with said mask (M-1), and the mask (M-2) for the continuous tone image is removed, and (2) exposure to the line images which is performed by exposing the sensitive material (P) to the original in which the continuous tone image is covered with the mask (M-1).

4 Claims, No Drawings they permit
METHOD FOR DIRECT MAKING OF LITHOGRAPHIC PRINTING PLATES This is a continuation of application Ser. No. 832,772, filed Feb. 25, 1986, now abandoned.

BACKGROUND OF THE INVENTION

This invention relates to a method for making lithographic printing plates directly from a block copy, that is, a method for the direct making of lithographic printing plates. More particularly, it relates to a method for the direct making of multicolor printing plates by using a panchromatic photosensitive material of the lithographic type and directly photographing an original bearing a continuous tone image and a line image.

At present, a large variety of photosensitive materials of the lithographic type are known and many of them are in actual use. As typical examples, there may be mentioned presensitized plates employing a diazonium compound; electrophotographic materials employing zinc oxide or an organic photoconductor; and silver salt photographic materials employing a silver halide emulsion. Especially, the sensitive materials having a high sensitivity such as the latter two of the above sensitive materials are suitable for use in direct plate making and have become remarkably popular, because they permit convenient and rapid plate making in an automatic plate making machine starting from the photographing of an original to be printed and throughout subsequent processing. In particular, those sensitive materials for direct plate making which employ silver salts as the sensitive constituents are useful because of their sensitivity, contrast, and resolving power which are very high.

There has been proposed a process of multicolor printing which takes advantage of the method of direct printing plate making. In this process, a panchromatic sensitive material of the lithographic type is brought into close contact with a contact screen and is exposed to a block copy bearing continuous tone images, e.g. a color photograph, and line images, e.g. letters or lines using color separation filters to make a cyan plate, a magenta plate, a yellow plate and a black plate.

For performing color printing with known presensitized plates, an image of photograph (called "continuous tone image" hereinafter) and an image of letters or lines (called "line image" hereinafter) are separately printed on a lith film to produce intermediate originals and these lith films are contact-printed on the presensitized plates in conformity with the composition.

However, the direct plate making method does not use intermediate originals such as lith films and hence must use a complete block copy original having continuous tone images and line images constructed in conformity with the desired composition. Therefore, the method requires exposure to a continuous tone image using contact screen and exposure to a line image without contact screen. For separate exposures to these two images, while one image which should not be subjected to exposure is covered with a mask, another image is subjected to exposure. However, in this case there are problems that a half tone dot image is formed in the line image area and half tone dots in the continuous tone image area become small or disappear. In most cases, the block copy bears the line images which are to be printed in an intended color by using at least one of the cyan, magenta, and yellow plates and other line images which are to be printed in black by using generally a black plate. This case presents problems such that in making a cyan, magenta, or yellow plate, the exposure should be performed so that a halftone dot image may not be formed in the areas of a sensitive material where the line image in color is to be formed, while in making a black plate the exposure should be performed so that any image may not be formed in the areas of line images and the halftone dots in the areas of continuous tone images may not be injured.

SUMMARY OF THE INVENTION

One object of this invention is to provide a plate making method suitable for multicolor direct plate making which comprises exposing a photosensitive material of the lithographic type to an original having a continuous tone image and line images. Another object of this invention is to provide a method for making a black plate in multicolor direct plate making method.

DESCRIPTION OF THE INVENTION

This invention relates to a method for the direct making of lithographic printing plate by exposing a photosensitive material of the lithographic type to a block copy bearing a continuous tone image and line images, which comprises exposing said photosensitive material to said block copy after covering a portion of the images with a mask having an optical reflectance of 2% or less and covering other unintended line images and/or continuous tone image with a mask having an optical reflectance of about 80% or more. Such a method makes it possible to prepare a desirable black plate by following the procedure mentioned below.

The present method for the direct making of multicolor printing plates is characterized by the procedure of exposing a photosensitive material (P) of the lithographic type to be used for making a black plate to an original bearing both the continuous tone image and the line images. The said procedure comprises (1) exposure to the continuous tone image which is performed by exposing the sensitive material (P) through a contact screen to the original in which the line images are covered with a mask (M-1) having an optical reflectance of 2% or less and the continuous tone image is covered with a mask (M-2) having a large optical reflectance, then again exposing, in the absence of contact screen, the sensitive material (P) to the original in which the line images are covered with said mask (M-1), and the mask (M-2) for the continuous tone image is removed, and (2) exposure to the line images which is performed by exposing the sensitive material (P) to the original in which the continuous tone image is covered with the mask (M-1).

In carring out the method of this invention, use may be made of a process camera described in detail in U.S. patent application Ser. No. 745,635 which permits the contact screen to be mounted or demounted under daylight, though other process cameras capable of mounting or demounting the contact screen on or from a photosensitive material (P) of the lithographic type placed on an exposure platen may also be used.

The invention is illustrated below with reference to Example, in which use is made of the process camera described in U.S. patent application Ser. No. 745,635 and a photosensitive material (P) of the lithographic type which has a panchromatically sensitized silver halide emulsion layer suitable for the silver complex diffusion transfer development.

EXAMPLE

A continuous tone multicolor photograph and letters in black were arranged according to a predetermined pattern to prepare an original to be mounted on an original holder. A heading letter A was to be printed in red and a text letter B in black (the letter original is not necessarily in black but can be in color).

A yellow plate was prepared as described below.

A grey contact screen (CS) of 150 lines/inch was set in place on a horizontal exposure platen and superimposed with a photosensitive material (P) of the lithographic type enclosed in a magazine. The photosensitive material (P) and the contact screen were brought into close contact by applying vacuum to become ready for exposure. A color filter holder was adjusted to set a blue filter in place in front of the lens. The letter A in the original was covered with a black mask (M-1) having an optical density of 2.0 (1% in optical reflectance) so as to be imaged as a line image (L-1) on the yellow plate. Since the letter B was to be imaged as line image (L-2) on a black plate, it was covered with a white mask (M-2) having an optical density of 0.07 (about 85% in optical reflectance) not so as to be imaged as line image (L-2) on the yellow plate. Using a light source for reflection exposure, the exposure for the photograph (C) in the original was performed under the conditions: $f=16$, 100 seconds. Subsequently a flash exposure ($f=16$, 3 seconds) was performed in a customary manner. The vacuum was then broken to remove the contact screen, while the sensitive material (P) remained as such. The letter A was imaged by exposing ($f=16$, 10 seconds) the sensitive material (P) to the original in which the black mask (M-1) which covered the letter A had been removed, while the letter B remained under the white mask (M-2) and the photograph areas had been covered with a black mask (M-1) having a reflectance as described above. The exposed sensitive material (P) was then sent to the processing section where it was subjected to developing, stopping, and desensitizing treatments to produce a yellow plate.

A magenta plate was prepared similarly to the yellow plate.

A cyan plate was prepared by imaging the photograph areas (C) of the original in which the letters A and B had been covered with the white mask (M-2) used above so that the letters may not be imaged as line images (L-2).

The procedure of preparing a black plate is fully described below.

As known well, the black plate is used to enhance the contrast of high density or shadow areas of a continuous tone multicolor original or to cover the error in grey balance among three color inks of cyan, magenta, and yellow. It is a general practice to prepare a black plate so that the specific dot area may become 5% for the shadow areas of an optical density of about 1.0 in the original and 50% for those of an optical density of about 2.0. In the direct making of a lithographic printing plate, the block copy frequently bears a continuous tone image and line images such as the letter B which is to be printed in black. In such a case, even when the letter B is covered with the mask (M-1), an exposure of the sensitive material (P) to the continuous tone image through a contact screen will result in dot formation in the image area of B. An important feature of the present invention is the procedure of preparing a black plate having a dot image corresponding to the shadow area of the original by two consecutive exposures, the one being performed through a contact screen to the original having its letter B covered with the mask (M-1) and its continuous tone multicolor photograph areas covered with the mask (M-2) (such an exposure to form only halftone dot image is referred to as plain halftone dot exposure) and the other being performed, in the absence of a contact screen, imagewise to the original. More particularly, the first exposure ($f=16$, 3 seconds) is performed through a contact screen to the original having both the letter A and the photograph areas covered with the white mask (M-2) and the letter B covered with the black mask (M-1). The second exposure ($f=16$, 4 seconds) is performed in the absence of contact screen to the photograph areas of the original after having the white mask (M-2) removed. The sensitive material is finally exposed ($f=16$, 3 seconds) to a line image of letter B of the original having its photograph areas covered with the black mask (M-1) and the black mask (M-1) on the letter B removed. The letter A is covered with the white mask (M-2) in order to prevent the formation of image of letter A on the black plate. It is sufficient to mask the letter A in at least one exposure in the absence of a contact screen. The plain exposure is performed preferably so as to form halftone dots at a specific dot area of about 70 to about 90%.

In the preparation of a black plate as described above, use was made of a white mask (M-2) having an optical reflectance of 85% to perform the plain exposure and to mask the letter A. However, a white mask (M-2) having a lower reflectance can be used, because the black mask (M-1) employed to cover the letter B has a very low reflectance and the letter A receives a plurality of exposures. It is possible to use a mask having generally a reflectance of 50% or more (such a mask is referred to as a mask having a large reflectance), preferably 70% or more.

The amount of exposure for the continuous tone color original without a contact screen can be determined by taking into account the amount of exposure for the line image. The total amount of exposures including the plain exposure is preferably a value sufficient to form halftone dots of 5% in specific dot area corresponding to the area of about 1.0 in optical density in the original. The amounts of two exposures and the ratio between them depend considerably upon the subjective point of view with respect to the quality of a color print and, hence, should be suitably determined according to the circumstances. The order of the two exposures is optional.

The term "optical reflectance" or "reflectance" of a mask, as used herein in the preparation of a black plate, means the ratio of the intensity of reflected light to that of incident light from a light source in the process camera; when an amber filter is used, the proportion of light passing through it. Although the mask can be colored in accordance with the color of a cyan or magenta plate, yet a mask in neutral color such as black or white is generally used. The material of a mask can be paper, film, or any other material. In any of the plates, the order of exposure to a continuous tone image and a line image can be reversed.

The color printing was performed by using the yellow, magenta, cyan, and black plates obtained as described above. It was found that there was entirely no dot formation in the area of heading letter A (red) and text letter B (black), and the reproduced color photograph was of excellent dot quality, and the color reproducibility was faithful to the original.

The above procedure was repeated, except that a black mask (M-1) having an optical reflectance of 2% was used. The results obtained were satisfactory. When a black mask having an optical reflectance of 3% or 5% was used, dots were formed in the area of reproduced letters A and B and the dots of reproduced color photograph became smaller in size or tiny dots disappeared, thus affecting adversely the color reproducibility.

The white mask (M-2) used to mask line images in the original more preferably has an optical reflectance of 80% or more. It was found that if the reflectance is about 70%, there are formed dots in the line image areas where dots should not be formed in the particular plate. The masking with the white mask (M-2) can be omitted in some cases such as, for example, the case wherein the print is required to reproduce only a photograph and monochromatic letters.

The term "optical reflectance" (or briefly "reflectance"), as used herein, means the ratio of the intensity of reflected light to that of incident light from a light source for the exposure in the process camera. The incident light is the light corresponding to the sensitive region of the sensitive material (P); when a color separation filter is used, it is the light passing through the filter. Accordingly, the mask can be colored in accordance with the color of a cyan or magenta plate, but it is generally advantageous to use a mask in neutral color such as black mask or white mask. The mask can be of any material such as paper or film and is prepared in accordance with the shape and size or images in the original.

According to this invention, it is possible to obtain a printed copy of good quality from a finished block copy which involves a continuous tone image and line images, both of which not interfering with each other in the print.

What is claimed is:

1. A method for making a black plate by exposing a panchromatically spectral sensitized photosensitive material to a block copy having multicolor continuous tone images and line images, comprising the following steps:
   (1) exposing the photosensitive material in close contact with a contact screen to the block copy, with the line images of the block copy being covered with a black mask (M-1) of 2% or less in optical reflectance and the multicolor continuous tone images of the block copy being covered with a white mask (M-2) of about 50% or more in optical reflectance;
   (2) exposing the photosensitive material to the multicolor continuous tone images without the contact screen and the mask (M-2), and with the line images being covered with mask (M-1); and
   (3) exposing the photosensitive material to the line images without the mask, and with the multicolor continuous tone images being covered with mask (M-1).

2. A method according to claim 1 wherein said mask (M-2) has an optical reflectance of about 80% or more.

3. A method according to claim 1 wherein the mask (M-2) has an optical reflectance of about 70% or more.

4. A method according to claim 1 wherein the photosensitive material (P) has a panchromatically spectral-sensitized silver halide emulsion layer.

* * * * *